United States Patent
Nguyen et al.

(10) Patent No.: US 8,895,353 B2
(45) Date of Patent: Nov. 25, 2014

(54) CATIONIC CONJUGATED POLYELECTROLYTE ELECTRON INJECTION LAYERS ALTERED WITH COUNTER ANIONS HAVING OXIDATIVE PROPERTIES

(75) Inventors: Thuc-Quyen Nguyen, Goleta, CA (US); Andres Garcia, Los Angeles, CA (US); Jacek Brzezinski, Lompoc, CA (US)

(73) Assignee: The Regents of the University of California, Oakland, CA (US)

( * ) Notice: Subject to any disclaimer, the term of this patent is extended or adjusted under 35 U.S.C. 154(b) by 297 days.

(21) Appl. No.: 12/603,399

(22) Filed: Oct. 21, 2009

(65) Prior Publication Data

US 2010/0096656 A1    Apr. 22, 2010

Related U.S. Application Data

(60) Provisional application No. 61/107,231, filed on Oct. 21, 2008.

(51) Int. Cl.
H01L 51/56 (2006.01)
H01L 51/50 (2006.01)

(52) U.S. Cl.
CPC ....... *H01L 51/5088* (2013.01); *H01L 2251/552* (2013.01)
USPC .................. 438/99; 438/14; 257/E51.018

(58) Field of Classification Search
CPC ............................................ H01L 22/00–22/34
USPC .............. 257/40, E51.001–E51.052, 79–103; 313/504; 428/690, 917; 438/99, 14–18, 438/22–47; 702/117–120
See application file for complete search history.

(56) References Cited

U.S. PATENT DOCUMENTS

| | | | |
|---|---|---|---|
| 5,895,717 A * | 4/1999 | Cao et al. | 428/411.1 |
| 5,965,901 A * | 10/1999 | Heeks et al. | 257/40 |
| 2007/0215865 A1* | 9/2007 | Liu et al. | 257/40 |
| 2008/0015269 A1 | 1/2008 | Bazan et al. | |

OTHER PUBLICATIONS

Monteserin, M., et al. "Modulating the Emission Intensity of Poly-(9,9-bis(6'-N,N,N-trimethylammonium)hexyl)-Fluorene Phenylene) Bromide Through Interaction with Sodium Alkylsulfonate Surfactants." J. Phys. Chem. B, vol. 111 (2007): pp. 13560-13569.*
Wang, L., et al. "Utilization of Water/Alcohol-Soluble Polyelectrolyte as an Electron Injection Layer for Fabrication of High-Efficiency Multilayer Saturated Red-Phosphorescence Polymer Light-Emitting Diodes by Solution Processing." Appl. Phys. Lett., vol. 89, Article 151115 (2006): pp. 1-3.*
Wu, H., et al. "Efficient Electron Injection from Bilayer Cathode Consisting of Aluminum and Alcohol/Water-Soluble Conjugated Polymers." J. SID, vol. 13 (2005): pp. 123-130.*

(Continued)

*Primary Examiner* — Mark Tornow
*Assistant Examiner* — Eric Ward
(74) *Attorney, Agent, or Firm* — Gates & Cooper LLP

(57) ABSTRACT

Counter anions having oxidative properties alter the performance of solution processed multilayer polymer light emitting diodes (PLEDs) that use cationic conjugated polyelectrolytes (CPEs) as electron injection layers (EILs). In some versions, PLEDs with poly(2-methoxy-5-(2'-ethylhexyloxy)-1,4-phenylene vinylene) (MEH-PPV) emissive layers and cationic CPE EILs are altered with halide counter anions to exhibit a systematic increase in device performance. Exemplary oxidative counter anions are halide counter anions with $F^->Cl^->Br^->I^-$ in terms of device performance.

13 Claims, 6 Drawing Sheets

(56) References Cited

OTHER PUBLICATIONS

Garcia, A., et al. "Structure-Function Relationships of Conjugated Polyelectrolye Electron Injection Layers in Polymer Light Emitting Diodes." Appl. Phys. Lett., vol. 91 (Oct. 8, 2007): Article 153502.*
Kulkarni, A. P.; Tonzola, C. J.; Babel, A.; Jenekhe, S. A. *Chem. Mater.* 2004, 16, 4556.
Friend, R. H.; Gymer, R. W.; Holmes, A. B.; Burroughes, J. H.; Marks, R. N.; Taliani, C.; Bradley, D. D. C.; Dos Santos, D. A.; Brédas, J. L.; Lögdlund, M.; Salaneck, W. R. *Nature* 1999, 397, 121.
Scott, J. C.; Kaufman, J. H.; Brock, P. J.; DiPietro, R.; Salem, J.; Goitia, J. A. *J. Appl. Phys.* 1996, 79, 2745.
Cao, Y.; Yu, G.; Parker, I. D.; Heeger, A. J. *J. Appl. Phys.* 2000, 88, 3618.
Wu, H.; Huang, F.; Mo, Y.; Yang, W.; Wang, D.; Peng, J.; Cao, Y. *Adv. Mater.* 2004, 16, 1826.
Wu, H.; Huang, F.; Peng, J.; Cao, Y. *Org. Electron.* 2005, 6, 118.
C Hoven, C.; Yang, R.; Garcia, A.; Heeger, A. J.; Nguyen, T. Q.; Bazan, G. C. *J. Am. Chem. Soc.* 2007, 129, 10976.
Ma, W.; Iyer, P. K.; Gong, X.; Liu, B.; Mosese, D.; Bazan, G. C.; Heeger, A. J. *Adv. Mater.* 2005, 17, 274.
Garcia, A.; Yang, R.; Jin, Y.; Walker, B.; Ngyen, T. Q. *Appl. Phys. Lett.* 2007, 153502.
Niu, X.; Qin, C.; Zhang, B.; Yang, J.; Xie, Z.; Cheng, Y.; Wang, L. *Appl. Phys. Lett.* 2007, 90, 203513.
Yang, R.; Wu, H.; Cao, Y.; Bazan, G. C. *J. Am. Chem. Soc.* 2006, 128, 14422.
Steuerman, D. W.; Garcia, A.; Dante, M.; Yang, R.; Löfvander, J. P.; Ngyen, T. Q. *Adv. Mater.* 2008, 20, 528.
Zeng, W.; Wu, H.; Zhang, C.; Huang, F.; Peng, J.; Yang, W.; Cao, Y. *Adv. Mater.* 2007, 19, 810.
Neef, C. J.; Ferraris, J. P. *Macromolecules* 2000, 33, 2311.
Tan, C. Y; Pinto, M. R.; Schanze, K. S. *Chem. Commun.* 2002, 5, 446.
Schnablegger, H.; Antonietti, M.; Göltner, ; Hartmann, J.; Cölfen, H.; Samori, P.; Rabe, J. P.; Häger, H.; Heitz, W. *J. Colloid Interface Sci.* 1999, 212, 24.
Pinto, M. R.; Kristal, B. M.; Schanze, K. S. *Langmuir* 2003, 19, 6523.
Gao, Y.; Wang, C. C.; Wang, L.; Wang, H. L. *Langmuir* 2007, 23, 7760.
Wang, F.; Bazan, G. C. *J. Am. Chem. Soc.* 2006, 128, 15795.
Nguyen, T. Q.; Martini, I. B.; Liu, J.; Schwartz, B. J. *J. Phys. Chem. B* 2000, 104, 237.
Yang, R.; Garcia, A.; Korystov, D.; Mikhailovsky, A.; Bazan, G. C.; Nguyen, T. Q. *J. Am. Chem. Soc.* 2006, 128, 16532.
Blom, P. W. M.; de Jong, M. J. M.; Vleggaar, J. J. M. *Appl. Phys. Lett.* 1996, 68, 3308.
Blom, P. W. M.; de Jong, M. J. M.; van Munster, M. G. *Phys. Rev. B.* 1997, 55, R656.
Huang, F.; Wu, H.; Wang, D.; Yang, W.; Cao. Y. *Chem. Mater.* 2004, 16, 708.
Garcia, A.; Nguyen, T. Q. *J. Phys. Chem. C.* 2008, 112, 7054.
Bozano, L.; Carter, S. A.; Scott, J. C.; Malliaras, G. G.; Brock, P. J. *Appl. Phys. Lett.* 1999, 74, 1132.
Goh, C.; Kline, R. J.; McGehee, M. D.; Kadnikova, E. N.; Fréchet, J. M. J. *Appl. Phys. Lett.* 2005, 86, 122110.
Chirvase, D.; Chiguvare, Z.; Knipper, M.; Parisi, J.; Dyakonov, V.; Hummelen, J. C. *J. Appl. Phys.* 2003, 93, 3376.
Jain, S. C.; Geens, W.; Mehra, A.; Kumar, V.; Aernouts, T.; Poortmans, J.; Mertens, R. *J. Appl. Phys.* 2001, 89, 3804.
Ishii, H.; Sugiyama, K.; Ito, E.; Seki, K. *Adv. Mater.* 1999, 11,605.
Brown, T. M.; Millard, I. S.; Lacey, D. J.; Butler, T.; Burroughes, J. H.; Friend, R. H. *J. Appl. Phys.* 2003, 93, 6159.
Zhang, F. J.; Vollmer, A.; Zhang, J.; Xu, Z.; Rabe, J. P.; Koch, N. *Org. Electron.* 2007, 8, 606.
de Leeuw, D. M.; Simenon, M. M. J.; Brown, A. R.; Einerhand, R. E. F. *Sythn. Met.* 1997, 87, 53.
Edman, L.; Moses, D.; Heeger, A. J. *Sythn. Met.* 2003, 138, 441.
Campbell, I. H.; Hagler, T. W.; Smith, D. L. *Phys. Rev. Lett.* 1996, 76, 1900.
Yang, R et al, "Control of Interchain Contacts, Solid-State Fluorescence Quantum Yield, and Charge Transport of Cationic conjugated Polyelectrolytes by Anion," J. of American Chemical Society (JACS) vol. 128 No. 51, p. 16532-16539, 2006.
C. V. Hoven et al., "Recent Applications of Conjugated Polyelectrolyes in Optoelectronic Devices," Advanced Materials, vol. 20 No. 20 p. 3793-3810 2008.
C. V. Hoven et al. "Electron injection into organic semiconductor devices from high work function cathodes," Proceedings of the National Academy of Sciences USA. vol. 105, #35, p. 12730-12735, 2008.
B. Walker et al. "Solution Processed Small Molecule Light-Emitting Diodes Using Conjugated Polyelectrolyes as Electron Injection Layers," Applied Physics Letters vol. 93, p. 063302-063305, 2008.

* cited by examiner

CATIONIC CONJUGATED POLYELECTROLYTE ELECTRON INJECTION LAYERS ALTERED WITH COUNTER ANIONS HAVING OXIDATIVE PROPERTIES

CROSS-REFERENCE TO RELATED APPLICATIONS

This application claims the benefit of Provisional Patent Application No. 61/107,231, filed on Oct. 21, 2008, which is incorporated by reference herein.

BACKGROUND

1. Field of Invention

This invention relates to cationic conjugated polyelectrolyte electron injection layers.

2. Related Art

Charge injection and transport play an important role in organic light emitting diodes (OLEDs) (1,2). In OLEDs, holes are injected from the anode into the highest occupied molecular orbital (HOMO) of the organic semiconductor. Similarly, electrons flow from the cathode to the lowest unoccupied molecular orbital (LUMO). A balance of injection and transport of both charge carriers is needed to increase the probability of hole/electron recombination, and hence, improve the light output at a given current density. In the absence of interfacial effects one needs to match the energies of the HOMO and the LUMO with the work function of the anode and cathode, respectively, so to minimize the injection barriers. Stable metals have high work function that give rise to large electron injection barriers. One therefore needs to rely on multilayer devices or the use of less stable low work function cathodes such as barium and calcium (3,4).

Recently, conjugated polyelectrolytes (CPEs) have been shown as effective electron injecting layers (EIL) in polymer LEDs (PLEDs) leading to enhance performances with environmentally stable cathodes such as Au, Ag, Cu and Al (5-12). CPEs are composed of a π-conjugated backbone with pendant groups bearing ionic functionalities. The ionic functionalities allows the fabrication of multilayer devices by solution process without significant perturbation of the underneath layer by taking advantage of the solubility of CPEs in polar solvents (13). The operating mechanism for the reduction of electron injection barrier remains under debate with one model predicting the formation of permanent interfacial dipoles between the cathode and the CPE (5). Another model incorporates the notion of ion migration by the applied electric field, leading to redistribution of the internal field within the CPE EIL, in addition to the contribution of interfacial dipoles (7).

A number of CPE structures have been reported with a variety of conjugated backbones, appended ionic functionalities and counter ions. These materials lead to a variety of device performances that are not fully understood)9-11). Recently, a systematic investigation of various conjugated backbones on device performance was reported with direct correlation of the electron mobility of the CPE EIL with device performance (9). Organic counter ion alteration of CPEs has also been shown to lead to orders of magnitude differences in device performance (12). Though the behavior of CPE EILs in PLEDs is attractive for inexpensive all solution processed commercial applications (13) the CPEs properties influence on device performance and optimization is not fully understood.

SUMMARY

In one aspect, a method of increasing the performance of a multilayer polymer light emitting diode is provided. The PLED contains an emissive layer and a cationic conjugated polyelectrolyte electron injection layer. The method contains the feature of including a counter anion having oxidative properties in the electron injection layer. In some embodiments of the method, the CPE EIL is a solution processed CPE EIL. In some embodiments of the method, including but not limited to solution processed CPE EIL embodiments, the counter anion undergoes oxidation at the boundary between the emissive layer and CPE EIL. Also, in various embodiments of the method, including but not limited to solution processed CPE EIL embodiments and embodiments where the counter anion undergoes oxidation, the counter anion is selected by considering at least its oxidative properties.

The counter anion is a halide counter anion in various embodiments of the method, including but not limited to solution processed CPE EIL embodiments, embodiments where the counter anion undergoes oxidation, and embodiments where the counter anion is selected by considering its oxidative properties. In certain embodiments where the counter anion is a halide anion, the halide counter anion is provided by $PFN^+X^-$ (that is, poly[9,9-bis[6'-(N,N,N-trimethylammonium)hexyl]fluorene-alt-co-1,4-phenylene]$^+X^-$) as the electron injection layer, where X is one of the halides is F, Cl, Br, or I. Particular embodiments of $PFN^+X^-$ contain F as the halide. In embodiments where $PFN^+X^-$ is the electron injection layer, the PLED can contain an emissive layer formed of MEH-PPV (that is, poly(2-methoxy-5-(2'-ethylhexyloxy)-1,4-phenylene vinylene) in contact with the $PFN^+X^-$ electron injection layer.

In another aspect, a method is provided of increasing the performance of a multilayer polymer light emitting diode that contains an emissive layer and a cationic conjugated polyelectrolyte electron injection layer. The method includes preparing a plurality of multilayer polymer light emitting diodes, with each diode containing the cationic conjugated polyelectrolyte electron injection layer and a counter anion included in the electron injection layer. The counter anion is selected by considering at least its oxidative properties, and the counter anion of each diode differs from the counter anion of the other multilayer polymer light emitting diodes. The method also includes determining the performance of the plurality of polymer light emitting diodes to identify one of the diodes that performs better than another of the diodes, which can include identifying one that performs the best of all the diodes. In certain embodiments of the method, the CPE EIL is a solution processed CPE EIL. Also, in some embodiments of the method, including but not limited to solution processed CPE EIL embodiments, the counter anion can be a halide counter anion.

In a further aspect, a device comprising a PLED having a cationic conjugated polyelectrolyte electron injection layer is provided. The PLED also includes a counter anion with oxidative properties in the electron injection layer. In some embodiments of the device, the cationic conjugated polyelectrolyte electron injection layer is a solution processed layer. In some embodiments of the device, including but not limited to embodiments containing a solution processed layer, the counter anion undergoes oxidation at the boundary between an emissive layer of the PLED and the CPE EIL during device operation. Also, in various embodiments of the device, including but not limited to solution processed CPE EIL embodiments and embodiments where the counter anion undergoes oxidation, the counter anion is selected by considering at least its oxidative properties.

The counter anion is a halide counter anion in various embodiments of the device, including but not limited to solution processed CPE EIL embodiments, embodiments where the counter anion undergoes oxidation, and embodiments where the counter anion is selected by considering its oxidative properties. In certain embodiments where the counter anion is a halide anion, the halide counter anion is provided by PFN$^+$X$^-$ (that is, poly[9,9-bis[6'-(N,N,N-trimethylammonium)hexyl]fluorene-alt-co-1,4-phenylene]$^+$X$^-$) as the electron injection layer, where X is one of the halides is F, Cl, Br, or I. Particular embodiments of PFN$^+$X$^-$ contain F as the halide. In embodiments where PFN$^+$X$^-$ is the electron injection layer, the PLED can contain an emissive layer formed of MEH-PPV (that is, poly(2-methoxy-5-(2'-ethylhexyloxy)-1, 4-phenylene vinylene) in contact with the PFN$^+$X$^-$ electron injection layer.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
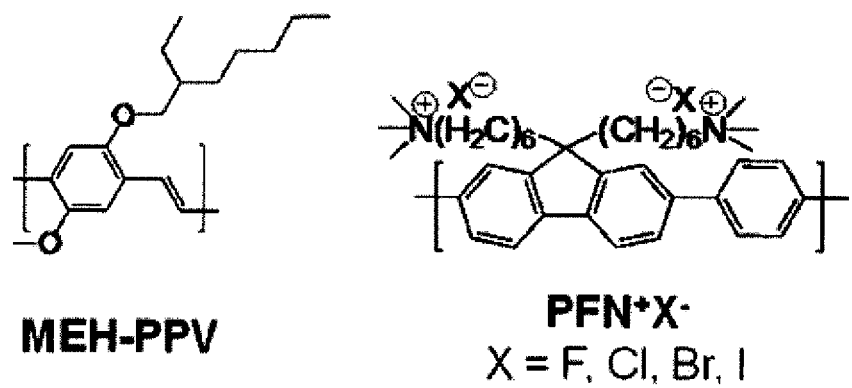
FIG. 1(a) is a representation of the chemical structures of MEH-PPV and CPEs used as emissive and electron injection layers, respectively.

In accordance with any embodiment of the invention, PLEDs containing an emissive layer and a cationic conjugated polyelectrolyte electron injection layer also include a counter anion in the electron injection layer, with the counter anion having oxidative properties. Examples of polymers for use in PLEDs include, but are not limited to, poly(2-methoxy-5-(2'-ethylhexyloxy)-1,4-phenylene vinylene) (MEH-PPV), [poly(9,9-dioctylfluorene-2,7-diyl),poly(2-4(-3'7'-dimethyloctyloxy)-phenyl)-p-phenylenevinylene), and poly(9,9-dioctylfluorene-co-benzothiadiazole). Examples of CPEs for use in EILs include, but are not limited to, poly[9,9-bis[6'-(N,N,N-trimethylammonium)hexyl]fluorene-alt-co-1,4-phenylene] (PFN$^+$), poly(9,9-bis(6'-(N,N,N-trimethylammonium)hexyl)fluorene, poly(9,9-bis(6'-(N,N,N-trimethylammonium)hexyl)-fluorene-2,7-diyl)-alt-(2,5,-bis)p-phenylene)-1,3,4-oxadiazole), and poly(9,9-bis(6'-(N,N,N-trimethylammonium)hexyl]-fluorene-alt-4,7-(2,1,3-benzothiazole). Examples of counter anions for use in EILs include, but are not limited to, halides, tetrakis(1-imidazoly)borate, tetraphenylborate, trifluoromethanesulfonate, and hexafluorophosphate. A CPE EIL can be a solution processed layer.

In some embodiments, PLEDs contain PFN$^+$X$^-$ as the EIL, where X is a halide. Examples of other cationic conjugated polyelectrolytes for combination with halide counter anions include, but are not limited to poly(9,9-bis(6'-(N,N,N-trimethylammonium) hexyl)fluorene, poly(9,9-bis(6'-(N,N,N-trimethylammonium)hexyl)-fluorene-2,7-diy1)-alt-(2,5,-bis)p-phenylene)-1,3,4-oxadiazole), and poly(9,9-bis(6'-(N,N,N-trimethylammonium)hexyl)-fluorene-alt-4,7-(2,1,3-benzothiazole). Examples of other combinations of cationic CPE and counter anion include, but are not limited to poly(9,9-bis(6'-(N,N,N-trimethylammonium)hexyl)fluorene/tetrakis(1-imidazoly)borate, poly(9,9-bis(6'-(N,N,N-trimethylammonium)hexyl)-fluorene-alt-4,7-(2,1,3-enzothiazole)/tetraphenylborate, and poly(9,9-bis(6'-(N,N,N-trimethylammonium)hexyl)-fluorene-2,7-diyl)-alt-(2,5,-bis)p-phenylene)-1,3,4-oxadiazole)/tetrakis(1-imidazoly) borate.

A device in accordance with any embodiment of the invention can be a PLED, or can include one or more PLEDs. Devices that include one or more PLEDs include an organic light-emitting display, organic light-emitting lighting, and organic light-emitting lasers.

In accordance with various embodiments of the invention, halide counter anions can alter and/or improve the performance of solution processed multilayer PLEDs that use cationic CPEs as EILs. In some embodiments, PLEDs with poly(2-methoxy-5-(2'-ethylhexyloxy)-1,4-phenylene vinylene) (MEH-PPV) emissive layers and poly[9,9-bis[6'-(N,N,N-trimethylammonium)hexyl]fluorene-alt-co-1,4-phenylene] (PEN$^+$) CPE EILs are altered with counter anions having oxidative properties to exhibit a systematic increase in device performance. Exemplary oxidative counter anions are halide counter anions, with F$^-$>Cl$^-$>Br$^-$>I$^-$ in terms of device performance of some embodiments. Oxidation of the counter anions is likely to occur at the emissive layer/CPE interface and is confirmed with pulse bias measurements which reduce ion migration to interfaces and hence results in an increase device efficiency with the more oxidation prone Br-containing CPE as predicted. In an embodiment of the invention, the influence of the redox properties of the counter ion in the CPE on PLED performance is a significant factor to be considered in the selection of CPEs as EILs.

PLEDs can be prepared according to standard procedures such as thermal deposition, vacuum deposition or solution processing. In solution processing, one or more layers can be applied in solution form. For example, the emissive layer and/or the CPE EIL can be applied by spin coating. Device performance can be determined by measuring, for example, current density versus voltage, luminance versus voltage and luminous efficiency versus current density.

In accordance with embodiments of the invention, different halide counter ions can influence the device performance of PLEDs containing a cationic CPE EIL. Using a test bed PLED containing MEH-PPV as the emissive layer and PFN$^+$ with a series of halide counter anions F⁻ (PFN⁺F⁻), Cl⁻ (PFN⁺Cl⁻), Br⁻ (PFN⁺Br⁻) and I⁻ (PFN⁺I⁻) as the EIL, large differences in devices performances can be observed. These differences correlate well with the redox properties of the halide species, thus indicating that oxidative properties of counter anions should be considered for improving device performance.

The present invention may be better understood by referring to the accompanying examples, which are intended for illustration purposes only and should not in any sense be construed as limiting the scope of the invention as defined in the claims appended hereto.

EXAMPLE 1

Methods and Materials

MEH-PPV (14) and PFN⁺Br⁻ (15) were synthesized according to previous reports. PFN⁺F⁻, PFN⁺Cl⁻ and PFN⁺I⁻ were acquired from PEN⁺Br⁻ ion exchange with dialysis membranes and mixing with the appropriate potassium salt. Cellulose ester dialysis membranes (Spectrum Laboratories, Inc.) with a 1,000 molecular weight cut off were filled with a water solution of PFN⁺Br⁻ followed by addition of excess amount (5:1 weight) of the appropriate potassium halide salt. The dialysis membrane were immersed in a stirred de-ionized water bath until the osmotic pressure was reduced (~4 days) when upon more salts were added. This was repeated three times followed by evaporation of water under reduce pressure. Counter ion exchange was confirmed with X-ray photoelectron spectroscopy (XPS) measurements of the powdered CPE samples with a Kratos Axis Ultra XPS system with a base pressure of $1\times10^{-10}$ mbar (UHV), using a monochromated Al Kα X-ray source at hv=1486 eV. The structures of MEH-PPV and PFN⁺X⁻ are shown in FIG. 1(a).

Samples were prepared on either quartz substrates (spectroscopic measurements) or indium tin oxide (ITO) substrates (electrical measurements) under a nitrogen atmosphere. Substrates were cleaned before use by heating in 70:30 (v/v) $H_2SO_4$:$H_2O_2$ solution (quartz only), followed by successive rinsing and ultrasonic treatment in water, acetone, isopropyl alcohol and then drying with $N_2$ gas and several hours in an oven. The substrates were treated with UV/$O_3$ prior to polymer deposition. UV-vis absorption and photoluminescences (PL) measurements of polymer films were recorded on a Shimadzu UV-2401 PC diode array spectrometer and a PTI Quantum Master fluorometer.

Figures 1B, 1C:
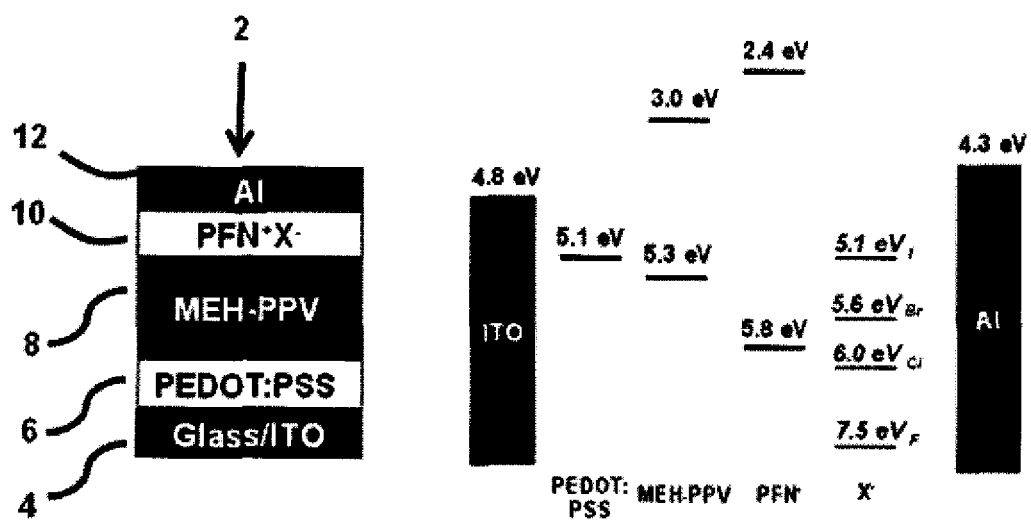
FIG. 1(b) is a schematic drawing of a multilayer PLED structure.
FIG. 1(c) is a representation of the energy levels of the PLED components.

For PLED fabrication 0.5% w/v solutions of MEH-PPV in toluene, 0.6% w/v methanol solutions of PFN⁺F⁻, PFN⁻Cl⁻ and PFN⁺Br⁻ and 0.6% w/v 1:4 v/v acetonitrile:methanol solutions of PFN⁺I⁻ were prepared and stirred at 40° C. overnight before use. ITO-coated glass substrates were used as the anode to which a solution of poly(3,4-ethylenedioxythiophene) poly(styrenrsulfonate) (PEDOT:PSS) was spun coat yielding a ~40 nm thick film. Following drying of the PEDOT:PSS film (150° C. for 1 hour), the MEH-PPV solution was spun coat at ~1,500 rpm on the ITO/PEDOT:PSS substrate yielding a ~80 nm thick film. This was followed by spin coating the CPE EIL layers at either 3000 rpm (PFN⁺F⁻, PFN⁺Cl⁻ and PFN⁺Br⁻) or 3500 rpm (PFN⁺I⁻) yielding ~25 nm thick films. The PLED devices were finally completed after drying the multilayer CP films under a $10^{-4}$ torr vacuum over night by thermal evaporation of Al cathode electrodes at pressure of $10^{-8}$ torr using a shadow mask. Referring to FIG. 1(b), the resulting PLED device 2 is shown having a Glass/ITO substrate 4, a PEDOT:PSS layer 6, a MEH-PPV emissive layer 8, a CPE electron injection layer 10, and an Al electrode 12. Two reference devices without the EIL layers, ITO/PEDOT:PSS/MEH-PPV/Al and ITO/PEDOT:PSS/MEH-PPV/Ba with a large electron injection barrier (Al) and no electron barrier (ohmic contact, Ba) were also fabricated for comparison (FIG. 1b). All devices were fabricated and tested in an inert $N_2$ atmosphere glove box.

Electron-only diodes devices were fabricated by deposition of 100 nm of Al on glass substrates followed by immediate spin coating 1.5% w/v CPE solutions at 800 rpm yielding>70 nm thick films. The films were then dried under $10^{-4}$ torr vacuum overnight before thermal evaporation of ~5 nm of Ba capped with 100 nm of Al. Current-Voltage (I-V) measurements were recorded with a Keithley 4200 SCS. Voltage measurements were performed with 0.05V steps and 500 ms delay time for linear increasing/decreasing voltage scans (non-pulse bias measurements) and with 500 ms off-times and 5 ms on-times for step-pulse voltage scans.

EXAMPLE 2

Materials Characterization

Figure 2:
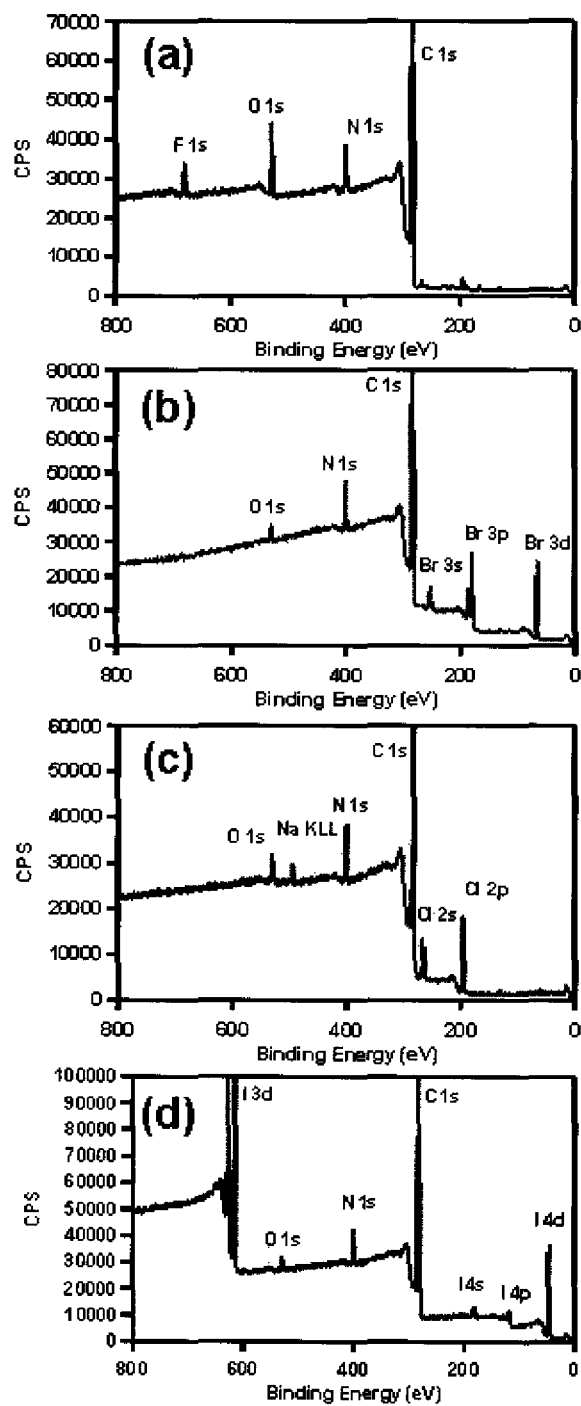
FIG. 2(a)-(d) are spectra of XPS measurements of conjugated polyelectrolytes PFN$^+$F$^-$, PFN$^+$Cl$^-$, PFN$^+$Br$^-$, and PFN$^+$I$^-$, respectively.

Devices prepared as in Example 1 were characterized.
Spectra of XPS measurements of CPE powder samples are shown in FIG. 2 for PFN⁺F⁻ (a), PFN⁺Cl⁻ (b), PFN⁺Br⁻ (c) and PFN⁺I⁻ (d) samples. All spectra exhibited the corresponding halide anion signals with no evidence of any potassium signals indicating the removal of the excess salt added in the anion exchange procedure. The degree of anion exchange was determine to be greater than 97% in all samples by comparison to bromide signals, indicating successful anion exchange.

Figure 3:
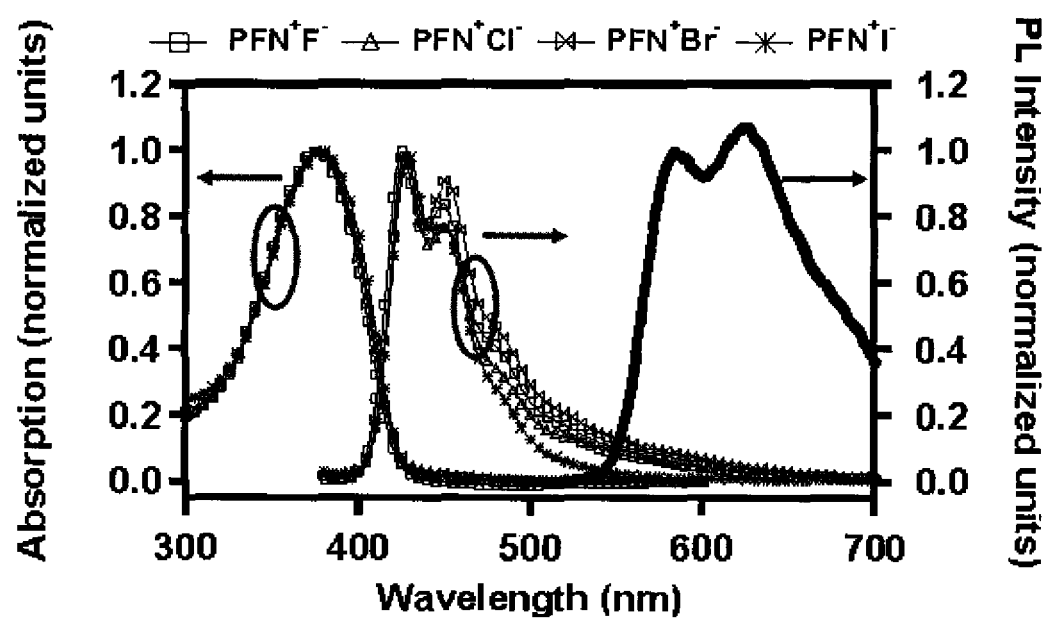
FIG. 3 is a diagram showing absorption and photoluminescence spectra of CPE films and EL spectrum of ITO/PEDOT:PSS/MEH-PPV/PFN$^+$F$^-$/Al device (black solid line)

The absorption and PL spectra of CPEs films are shown in FIG. 3. The absorption and PL spectra of all the CPEs are similar with insignificant changes in band width and absorption (~378 nm) and PL (~428 nm) maxima. The PL spectra exhibit vibronic progression and no additional broad bands at longer wavelengths, indicating lack of π-π aggregates commonly observed in CPEs films due to processing in polar medium (16-20). The spectroscopic similarities between the CPEs reveal no significant changes of the optical properties by the counter anion or the anion exchange procedure.

Device Characterization

Figure 4:
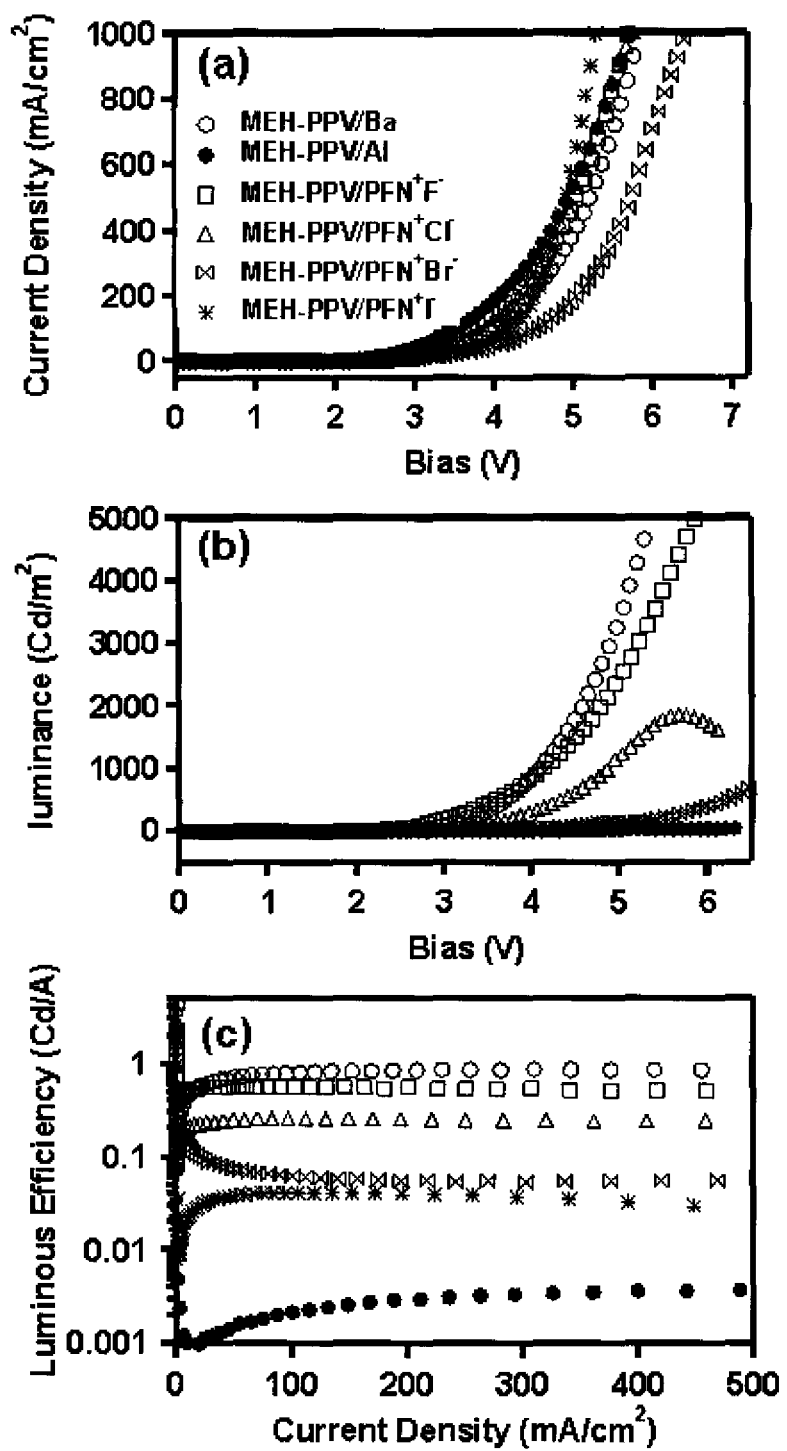
FIG. 4(a) is a diagram showing current density versus bias characteristics of multilayer PLEDs.
FIG. 4(b) is a diagram showing luminance versus bias characteristics of multilayer PLEDs.
FIG. 4(c) is a diagram showing luminous efficiency versus bias characteristics of multilayer PLEDs.

PLEDs devices fabricated with CPE EILs resulted in electroluminescence (EL) from MEH-PPV and not from the CPEs as shown in FIG. 3, illustrating the function of the CPEs as an electron injection and transport layer only. The EL spectra of the devices containing CPE EILs (shown for PFN⁺F⁻ only as an example) exhibit two broad band centered at 584 nm and 623 nm. The red shifted band indicates a certain degree of aggregation in the MEH-PPV film as has been reported (21). The current density versus voltage (J-V), luminance versus voltage (L-V) and luminous efficiency versus current density (LE-J) characteristics of PLEDs fabricated with CPE EIL (ITO/PEDOT:PSS/MEH-PPV/CPE/Al) and the two references devices (ITO/PEDOT:PSS/MEH-PPV/Al and ITO/PEDOT:PSS/MEH-PPV/Ba) are shown in FIG. 4. While similar current densities are observed with all devices there are differences in the luminance and luminous efficiency in devices with CPEs. A systematic increase in performance observed by increase luminance (1.8<8.9<34<220 s at 3V), decreased turn-on voltage (2.4V>2.2V>1.9V>1.9 V define at 0.1 lumens) and increased luminous efficiency (0.03<0.05<0.24<0.60 at 300 mA/cm²) is observed with CPE EILs with the following trend PEN⁺I⁻<PFN⁺Br⁻<PFN⁺Cl⁻

<PFN⁺F⁻. All devices with CPE EIL exhibit performances higher than the reference device ITO/PEDOT:PSS/MEH-PPV/Al indication that CPEs with any halide counter anion function as good EILs. The large electron injection barrier (~1.3 eV) in ITO/PEDOT:PSS/MEH-PPV/Al devices (FIG. 1c) results in poor performance, while excellent device performance (luminous efficiency≈0.9 Cd/A) is observed in ITO/PEDOT:PSS/MEH-PPV/Ba devices that have essentially no electron injection barrier ($\phi_{Ba}$≈2.7 eV). The improved performance in devices with CPE EIL from PFN⁺I⁻<PFN⁺Br⁻<PFN⁺Cl⁻<PFN⁺F⁻ closely reaches the performances of ITO/PEDOT:PSS/MEH-PPV/Ba.

The trend in device performance observed as a function of counter ion can arise from several possible factors such as differences in electron mobility, dipole formation at the CPE/Al interface, anion mobility, as well as differences in electrochemical stability. To disentangle some of these possible factors, the electron mobilities of the CPEs were measured. The dimension of the counter-anion of cationic polyfluorene CPEs have been shown to alter the electronic carrier mobility (23) and hence also PLED performance (9). Electron mobilities were measured according to previous reported methods that take advantage of electron-only diodes (9,23,24). These devices were fabricated by sandwiching a single CPE layer between two low work function electrodes. Such conditions lead to high hole injection barriers and low or no electron injection barriers; electrons are thus the majority carriers injected and transported. Devices with the structure glass/Al/CPE/Ba/Al exhibit a hole injection barrier (>1.5 eV) and a low electron injection barrier from Ba to the CPEs ($\phi_{Ba}$≈2.7 eV and LUMO$_{CPE}$≈2.2 eV) (25).

Figure 5:
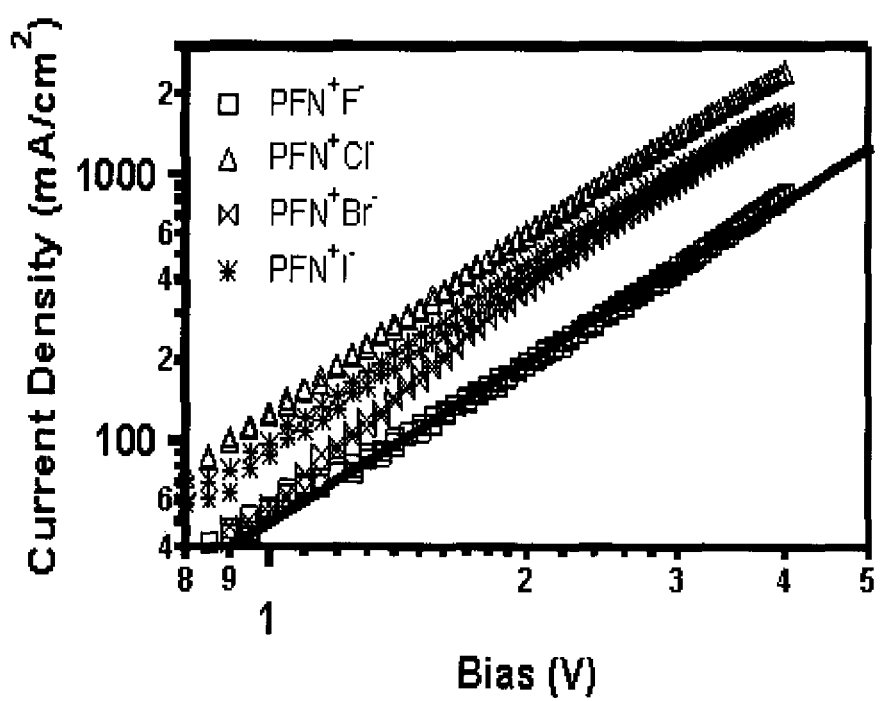
FIG. 5 is a diagram showing the current density versus bias characteristics of electron only diodes Al/PFN$^+$X$^-$/Ba/Al along with an example of a J $\alpha$ V$^2$ fitted curve.

The electron mobilities were determined from J-V measurements utilizing a stepped-pulse voltage as described in previous reports (9,26) to reduce ion motion. Ion motion in these mix/ionic charge carrier systems leads to modification of injection barriers and to light-emitting-electrochemical cell (LEC) behavior. No hysteresis and EL are observed for the step-pulsed voltage sweeps with a 500 ms off time (0V) and 5 ms on time (0V to 4V voltage sweep at 0.05V steps) (FIG. 5), an indication of negligible ion migration and modification of charge injection barriers. In FIG. 5 the J-V plots are shown along with an example of a curve fitted to the space-charge-limited-current (SCLC) equation $J=(9/8)\epsilon_o\epsilon_r\mu V^2/L^3$, from which electron mobilities can be extracted (23,24,27-32). In the SCLC equation, $\epsilon_o$ is the vacuum permittivity, $\epsilon_r$ is the relative dielectric constant of the film, μ is the electron mobility, V is the applied voltage and L is the thickness of the active layer. Electron mobilities of $3.0\times10^{-5}$, $6.7\times10^{-5}$, $1.2\times10^{-5}$ and $5.7\times10^{-5}$ cm²Vs were determined for PFN⁺F⁻, PFN⁺Cl⁻, PFN⁺Br⁻ and PFN⁺I⁻. The minor differences and absence of a clear trend suggest that the differences in carrier mobility between these CPEs is a minor factor, if at all, influencing the PLED device performances. A large difference in electron mobility as in previous studies in which greater than one order of magnitude was measured (22) is not observed likely due to the smaller differences in the anion ionic radius (1.33 Å, 1.81 Å, 1.96 Å and 2.20 Å for F⁻, Cl⁻, Br⁻ and I⁻, respectively) (32) and hence alteration of interchain polymer contacts in this system.

Differences in the interfacial dipole (33-35) between the CPE EILs and the Al cathode is another possible source in influencing the devices performances but is believed not to be the main contributor. The cationic charge of the CPE can provide an advantageous permanent dipole with the cathode that may reduce the electron injection barrier but is unlikely to be significantly altered between these CPEs since they are all composed of the identical CP backbone with identical cationic units and concentration.

The device performances correlate well with both the ionic radius and the oxidation potentials trend of the halide counter anions. With decrease in ionic radius (F⁻<Cl⁻<Br⁻<I⁻) as well as increase oxidation potential (F⁻>Cl⁻>Br⁻I⁻) of the halide counter anions a steady increase in device performance is observed. The ionic radius and ion mobility of the counter anions are not expected to be the main contributor to the trend observed since the CPE EILs with very different counter anions sizes (PFN⁺F⁻ and PEN⁺BIm₄⁻) (7) exhibit very similar device performances. The electrochemical stability of counter ions determined by their relative oxidation and reduction potentials, have been shown to influence the devices performance in LECs (37). A decrease in the electrochemical stability of the counter ions in LECs have been shown to lead to decrease device performance and is believed to be the factor influencing the device performance here. With ease of oxidation of the halide counter anions ($\phi_{F^-}$≈7.5eV, $\phi_{Cl^-}$≈6.0eV, $\phi_{Br^-}$≈5.6 eV and $\phi_{I^-}$≈5.1 eV) (32,36) a decrease in performance is observed, possibly by greater degree of oxidation of the counter anions in the EIL. Since the CPEs are operating as EIL and not as hole-injecting layers (HIL) the oxidation is expected to occur at the MEH-PPV/CPE interface. Under an applied voltage counter anions of the CPE EIL are speculated to migrate to the CP/CPE interface (7) where the accumulated holes in the MEH-PPV layer due to the hole blocking properties of the CPEs (HOMO$_{MEH-PPV}$≈5.3 Ev (38) versus HOMO$_{CPEs}$≈5.8 eV (25)) can possibly lead to the oxidation of the halide counter anions. Oxidation of counter anions is believed to led to reduce device performance by either or a combination of, degrading side reactions by the highly reactive radical species generated and/or diminishing injected hole and electron concentrations and hence recombination upon oxidation by hole followed by reduction by injected electrons in the EIL.

Figure 6A:
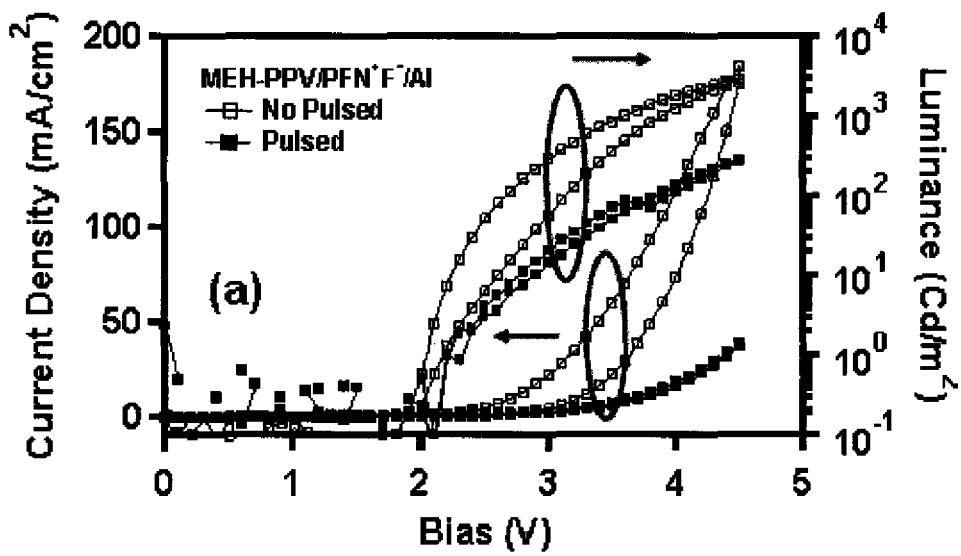
FIG. 6(a) is a diagram showing the current density versus bias and luminance versus bias characteristics with (solid squares) and without (open squares) step-pulse bias of ITO/PEDOT:PSS/MEH-PPV/PFN$^+$F$^-$/Al devices.
Figure 6B:
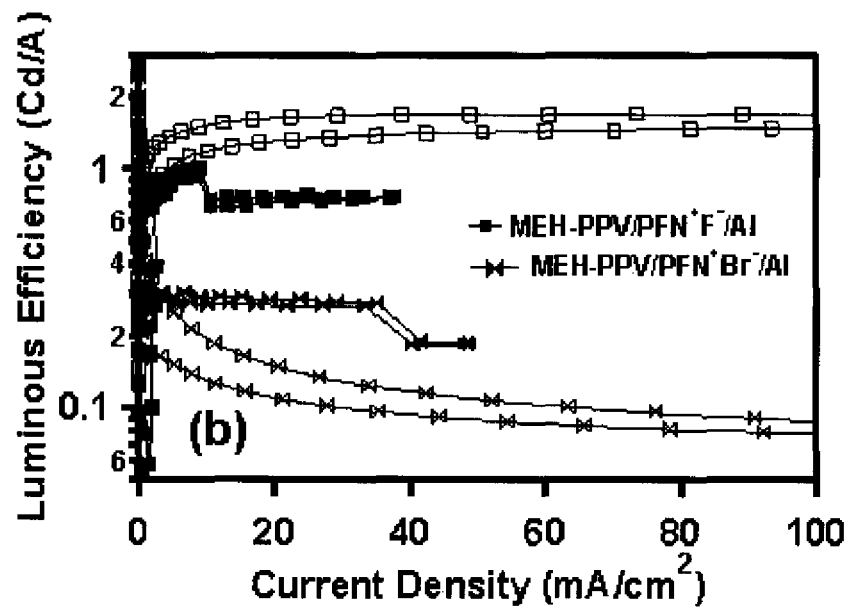
FIG. 6(b) is a diagram showing luminous efficiency versus current density of PLED devices with PFN$^+$F$^-$ or PFN$^+$Br$^-$ EILs measurement with (solid symbols) and without (open symbols) step pulsed bias.

Step pulse-voltage measurements of PLED devices were performed. Reduced ion motion to the CP/CPE interface with pulse bias measurements should lead, according to our proposed model, to a decrease in oxidation of less electrochemical stable counter anions (Br⁻ and I⁻), and hence to a relative increase in performances compared to non-pulsed bias measurements. Non-pulse and pulse bias measurements of PLEDs with CPE EILs were performed and are shown for PFN⁺F⁻ and PFN⁺Br⁻ in FIG. 6. Measurements were performed at lower voltages to prevent failing of devices which occurs between ~5.5 V and 8.0 V and with identical pulse sequence as with electron transport measurements. The current density and luminance versus bias of all PLEDs exhibit similar behavior upon pulse biasing and is shown for PFN⁺F⁻ containing EIL devices in FIG. 6a. With a pulse bias, a drop in current density and luminance, as well as a reduced hysteresis, between forward and reverse scans as compared to non-pulse bias scans is observed. Slight differences in the overall decrease in current density and luminance between pulse and non-pulse bias measurements were observed between different CPEs with a larger dropped with PFN⁺F⁻ and smaller dropped with PFN⁺I⁻. This behavior is indicative of reduce ion motion and hence reduce modification of electron injection barriers. With pulse bias measurements it is speculated that motion of counter anions away and the cationic units to the CPE/Al interface is reduce leading higher electron injection barriers than non-pulse bias measurements and hence lower current densities and luminance due to lower electron injection densities. The larger electron injection barrier with pulse bias measurements is also evident by the increase in the turn-on voltage from 1.9 V to 2.2 V and from 2.2 V to 2.6 V (not shown) in PLEDs with PFN$^+$F$^-$ and PFN$^+$Br$^-$ EILs. Interesting, approximately one order of magnitude increase in current density (16 to 119 mA/cm$^2$) and luminance (136 to 1258 Cd/m$^2$) for PEN$^+$F$^-$ EIL containing PLEDs with non-pulse bias measurements is observed at 4 V which was similarly observed in temporal measurements of similar PLEDs with CPE EILs (7). The increase in current density and luminance over time was attributed to the additional influence of mobile ions on the electron injection barrier and the pulse bias measurements presented here provide additional evidence of the influence of mobile ions.

Differences in performance with reduced ion migration in PLEDs determine from luminous efficiency versus current density plots (FIG. 6c) is observed and illustrate the effects of the counter anion properties on device performance. With reduced ion migration carried out with pulse bias measurements an opposite change in performance with PFN$^+$F$^-$ and PFN$^+$Br$^-$ EILs is observed. While a drop in luminous efficiency occurs in devices with a PFN$^+$F$^-$ EIL (1.33 to 0.73 Cd/A at 20 mA/cm$^2$), an increase in luminous efficiency is observed in devices with a PFN$^+$Br$^-$ EIL (0.13 to 0.27 Cd/A at 20 mA/cm$^2$). The drop in luminous efficiency observed with a PFN$^+$F$^-$ EIL is attributed to the larger electron injection barrier in pulse bias than in non-pulse bias measured devices due to the reduce ion migration and hence modification of the electron injection barrier. While reduce modification of the electron injection barrier with pulse bias measurements is also expected in devices with PFN$^+$Br$^-$ EILs a general increase in luminous efficiency with a pulse bias is observed. This increase in device performance is attributed to reduce ion migration to the CP/CPE interface in which oxidation of Br$^-$ counter anions is speculated to occur leading to reduce device performances. The lower lying oxidation potential of Br$^-$ (5.6 eV) than F$^-$ (~7.5 eV) can lead to a greater degree of oxidation of Br$^-$ counter anions at the MEH-PPV/CPE interface by accumulated holes (~5.2 eV) via tunneling of holes across the interface barrier (~0.4 eV) to the EIL. The general increase in luminous efficiency in devices with PFN$^+$Br$^-$ EILs illustrates the major contribution the electrochemical stability of the counter anion has on the device performance compare to ion migration, since reduce ion migration leading to reduce performance observed in the PFN$^+$F$^-$ system and would have been observed similarly in the PFN$^+$Br$^-$ system if it were a greater factor influencing the device performance. PLEDs with PFN$^+$Cl$^-$ EILs exhibit similar behavior to PEN$^+$F$^-$ containing PLEDs while PFN$^+$I$^-$ exhibit similar behavior as with PFN$^+$Br$^-$ containing PLEDs believed to be due to relative similar electrochemical properties.

EXAMPLE 3

Conclusions

In summary, a systematic investigation of the influence of the halide counter anion of CPE EILs on multilayer PLED device performance is presented. A general trend in device performance is observed with CPEs EILs containing halide counter anions (PFN$^+$F$^-$>PFN$^+$Cl$^-$>PFN$^+$Br$^-$>PFN$^+$I$^-$), which was determined to not correlate with difference in electron mobilities of the CPE, as has been observed in other CPE systems (9). Although not wishing to be bound by this idea, the device efficiency is believed to be influenced by the relative oxidation potential of the counter anion via oxidation by accumulated holes in the MEH-PPV/CPE interface. Measurements of the effects of reduced ion motion in PLED devices accomplished with pulse bias measurements results in a decrease in device efficiency with the relative more electrochemical stable PEN$^+$F$^-$ system while and an increase in device efficiency with relatively less electrochemically stable PFN$^+$Br$^-$ system. This correlates well with the model proposed in which the reduced migration of easily oxidized Br$^-$ counter anions to the MEH-PPV/CPE interface leads to decreased oxidation Br$^-$ counter anions and hence lessen the decrease in performance. The role of the redox properties of CPE counter ions in PLED EILs is a factor that has not receive much considered much but as has been shown can influence the device performance significantly and thus is necessary to considered and understand for implementation of CPEs in, and improvement of, PLED devices.

REFERENCES

The following publications, referred to above in parentheses, are incorporated by reference herein:
1. Kulkarni, A. P.; Tonzola, C. J.; Babel, A.; Jenekhe, S. A. *Chem. Mater.* 2004, 16, 4556.
2. Friend, R. H.; Gymer, R. W.; Holmes, A. B.; Burroughes, J. H.; Marks, R. N.; Taliani, C.; Bradley, D. D. C.; Dos Santos, D. A.; Brédas, J. L.; Lögdlund, M.; Salaneck, W. R. *Nature* 1999, 397, 121.
3. Scott, J. C.; Kaufman, J. H.; Brock, P. J.; DiPietro, R.; Salem, J.; Goitia, J. A. J. *Appl. Phys.* 1996, 79, 2745.
4. Cao, Y.; Yu, G.; Parker, I. D.; Heeger, A. J. *J Appl. Phys.* 2000, 88, 3618.
5. Wu, H.; Huang, F.; Mo, Y.; Yang, W.; Wang, D.; Peng, J.; Cao, Y. *Adv. Mater.* 2004, 16, 1826.
6. Wu, H.; Huang, F.; Peng, J.; Cao, Y. *Org. Electron.* 2005, 6, 118.
7. C Hoven, C.; Yang, R.; Garcia, A.; Heeger, A. J.; Nguyen, T. Q.; Bazan, G. C. *J. Am. Chem. Soc.* 2007, 129, 10976.
8. Ma, W.; Iyer, P. K.; Gong, X.; Liu, B.; Mosese, D.; Bazan, G. C.; Heeger, A. J. *Adv. Mater.* 2005, 17, 274.
9. Garcia, A.; Yang, R.; Jin, Y.; Walker, B.; Ngyen, T. Q. *Appl. Phys. Lett.* 2007, 91, 153502
10. Niu, X.; Qin, C.; Zhang, B.; Yang, J.; Xie, Z.; Cheng, Y.; Wang, L. *Appl. Phys. Lett.* 2007, 90, 203513.
11. Yang, R.; Wu, H.; Cao, Y.; Bazan, G. C. *J. Am. Chem. Soc.* 2006, 128, 14422.
12. Steuerman, D. W.; Garcia, A.; Dante, M.; Yang, R.; Löfvander, J. P.; Ngyen, T. Q. *Adv. Mater.* 2008, 20, 528.
13. Zeng, W.; Wu, H.; Zhang, C.; Huang, F.; Peng, J.; Yang, W.; Cao, Y. *Adv. Mater.* 2007, 19, 810.
14. Neef, C. J.; Ferraris, J. P. *Macromolecules* 2000, 33, 2311.
15. Yang, R.; Wu, H.; Cao, Y.; Bazan, G. C. *J. Am. Chem. Soc.* 2006, 129, 14422.
16. Tan, C. Y; Pinto, M. R.; Schanze, K. S. *Chem. Commun.* 2002, 5, 446.
17. Schnablegger, H.; Antonietti, M.; Göltner, ; Hartmann, J.; Cölfen, H.; Samori, P.; Rabe, J. P.; Häger, H.; Heitz, W. *J. Colloid Interface Sci.* 1999, 212, 24.
18. Pinto, M. R.; Kristal, B. M.; Schanze, K. S. *Langmuir* 2003, 19, 6523.
19. Gao, Y.; Wang, C. C.; Wang, L.; Wang, H. L. *Langmuir* 2007, 23, 7760.
20. Wang, F.; Bazan, G. C. *J. Am. Chem. Soc.* 2006, 128, 15795.
21. Nguyen, T. Q.; Martini, I. B.; Liu, J.; Schwartz, B. J. *J. Phys. Chem. B* 2000, 104, 237.
22. Yang, R.; Garcia, A.; Korystov, D.; Mikhailovsky, A.; Bazan, G. C.; Nguyen, T. Q. *J. Am. Chem. Soc.* 2006, 128, 16532.

23. Blom, P. W. M.; de Jong, M. J. M.; Vleggaar, J. J. M. *Appl. Phys. Lett.* 1996, 68, 3308.
24. Blom, P. W. M.; de Jong, M. J. M.; van Munster, M. G. *Phys. Rev. B.* 1997, 55, R656.
25. Huang, F.; Wu, H.; Wang, D.; Yang, W.; Cao. Y. *Chem. Mater.* 2004, 16, 708.
26. Garcia, A.; Nguyen, T. Q. *J. Phys. Chem. C.* 2008, 112, 7054.
27. Lampert, M. A.; Mark, P. *Current Injection in Solids* (Academic, New York, 1970).
28. Bozano, L.; Carter, S. A.; Scott, J. C.; Malliaras, G. G.; Brock, P. J. *Appl. Phys. Lett.* 1999, 74, 1132.
29. Goh, C.; Kline, R. J.; McGehee, M. D.; Kadnikova, E. N.; Fréchet, J. M. J. *Appl. Phys. Lett.* 2005, 86, 122110.
30. Chirvase, D.; Chiguvare, Z.; Knipper, M.; Parisi, J.; Dyakonov, V.; Hummelen, J. C. *J. Appl. Phys.* 2003, 93, 3376.
31. Jain, S. C.; Geens, W.; Mehra, A.; Kumar, V.; Aernouts, T.; Poortmans, J.; Mertens, R. *J. Appl. Phys.* 2001, 89, 3804.
32. CRC, Handbook of Chemistry and Physics, 88 th Ed. 2007/08, editor D. Lide, Cleveland, Ohio.
33. Ishii, H.; Sugiyama, K.; Ito, E.; Seki, K. *Adv. Mater.* 1999, 11, 605.
34. Brown, T. M.; Millard, I. S.; Lacey, D. J.; Butler, T.; Burroughes, J. H.; Friend, R. H. *J. Appl. Phys.* 2003, 93, 6159.
35. Zhang, F. J.; Vollmer, A.; Zhang, J.; Xu, Z.; Rabe, J. P.; Koch, N. *Org. Electron.* 2007, 8, 606.
36. de Leeuw, D. M.; Simenon, M. M. J.; Brown, A. R.; Einerhand, R. E. F. *Sythn. Met.* 1997, 87, 53.
37. Edman, L.; Moses, D.; Heeger, A. J. *Sythn. Met.* 2003, 138, 441.
38. Campbell, I. H.; Hagler, T. W.; Smith, D. L. *Phys. Rev. Lett.* 1996, 76, 1900.

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the following claims.

What is claimed is:

1. A method of increasing the performance of a multilayer polymer light emitting diode that contains an emissive layer, a cationic conjugated polyelectrolyte electron injection layer, and a cathode, the method comprising:
    selecting and including a counter anion having oxidative properties in the electron injection layer;
    pulse biasing and non-pulse biasing the polymer light emitting diode, wherein:
        the pulse biasing suppresses ion accumulation at an emissive layer/electron injection layer interface and at an electron injection layer/cathode interface, and
        the non-pulse biasing allows ion accumulation at the emissive layer/electron injection layer interface and at the electron injection layer/cathode interface; and
    measuring and comparing luminous efficiency of the pulse biased and non-pulse biased polymer light emitting diode to establish whether pulse biasing the polymer light emitting diode increases the luminous efficiency as compared to non-pulse biasing the polymer light emitting diode.

2. The method of claim 1, wherein the cationic conjugated polyelectrolyte electron injection layer is a solution processed layer and selecting the pulse biased polymer light emitting diode having the luminous efficiency increased by a factor of at least two as compared to the non-pulse biased polymer light emitting diode.

3. The method of claim 1, wherein the counter anion undergoes oxidation at the interface between the emissive layer and the cationic conjugated polyelectrolyte electron injection layer.

4. The method of claim 1, wherein:
    the counter anion is a halide counter anion,
    the pulse biasing is applied when the counter anion is $Br^-$ and when the counter anion is $I^-$,
    the non-pulse biasing is applied when the counter anion is $F^-$ and when the counter anion is $Cl^-$.

5. The method of claim 1, wherein the counter anion is provided by using $PFN^+X^-$ as the electron injection layer, wherein X is the counter anion.

6. The method of claim 5, wherein the counter anion is $Br^-$ or $I^-$.

7. The method of claim 5, wherein the polymer light emitting diode has an emissive layer comprising MEH-PPV in contact with the $PFN^+X^-$ electron injection layer.

8. A method of increasing the performance of a multilayer polymer light emitting diode that contains an emissive layer and a cationic conjugated polyelectrolyte electron injection layer, the method comprising:
    preparing a plurality of multilayer polymer light emitting diodes each comprising a cathode, the cationic conjugated polyelectrolyte electron injection layer and a counter anion included in the electron injection layer, the counter anion being capable of undergoing oxidation at the boundary between the emissive layer and the cationic conjugated polyelectrolyte electron injection layer and differing between the multilayer polymer light emitting diodes; and
    pulse biasing or applying a non-pulse bias to the polymer light emitting diodes depending on an oxidation potential of the counter anion, wherein:
    the counter anion is a Fluorine ion and the non-pulse bias is applied; and
    the counter anion is selected to exclude fluorine (F) atoms and have the oxidation potential lower than a Fluorine ion and a Chlorine ion and pulse biasing the polymer light emitting diodes to identify one of the diodes having a greater decrease in counter anion oxidation, as a result of suppressing ion migration and suppressing ion accumulation at an emissive layer/electron injection layer interface and at an electron injection layer/cathode interface, than another of the diodes.

9. The method of claim 8, wherein the cationic conjugated polyelectrolyte electron injection layer is a solution processed layer and selecting the polymer light emitting diodes having a luminous efficiency increased by a factor of at least two as a result of the pulse biasing and as compared to the non-pulse biased polymer light emitting diode having the counter anion excluding the Fluorine ion and the Chlorine ion.

10. The method of claim 8, wherein the counter anion is a halide counter anion and the pulse biasing is applied when the counter anion is a $Br^-$ and when the counter anion is $I^-$.

11. The method of claim 8, wherein the counter anion is provided by using $PFN^+X^-$ as the electron injection layer, wherein X is the counter anion.

12. The method of claim 11, wherein the emissive layer comprises MEH-PPV.

13. A method of modulating the performance of a multilayer polymer light emitting diode comprising an emissive layer, a cationic conjugated polyelectrolyte electron injection layer, and a cathode, the method comprising:
    (a) forming the electron injection layer to include a counter anion, wherein:

the counter anion is selected to exhibit oxidative properties in the electron injection layer;
(b) pulse biasing and applying a non-pulse bias to the polymer light emitting diode, wherein:
the pulse biasing suppresses ion migration and inhibits ion accumulation at an emissive layer/electron injection layer interface and at an electron injection layer/cathode interface, and
the non-pulse biasing allows ion accumulation at the emissive layer/electron injection layer interface and at the electron injection layer/cathode interface;
(c) measuring and comparing luminous efficiency of the pulse biased and non-pulse biased polymer light emitting diode; and
(d) selecting the pulse biased polymer light emitting diode if the pulse biased polymer light emitting diode has a higher luminous efficiency as compared to the non-pulse biased polymer light emitting diode, or selecting the non-pulse biased polymer light emitting diode if the non-pulse biased polymer light emitting diode has a higher luminous efficiency as compared to the pulse biased polymer light emitting diode, thereby selecting pulse biasing depending on the counter anion that is selected.

* * * * *